(12) United States Patent
Rijo da Costa Carvalho et al.

(10) Patent No.: US 10,493,451 B2
(45) Date of Patent: Dec. 3, 2019

(54) PHOTOCHEMICAL MODIFICATION OF A SOLID SURFACE

(71) Applicant: Micronit Microtechnologies B.V., Enschede (NL)

(72) Inventors: Rui Pedro Rijo da Costa Carvalho, Wageningen (NL); Sidharam Pundlik Pujari, Wageningen (NL); Elwin Xander Vrouwe, Enschede (NL); Johannes Teunis Zuilhof, Bennekom (NL)

(73) Assignee: Micronit Microtechnologies B.V., Enschede (NL)

( * ) Notice: Subject to any disclaimer, the term of this patent is extended or adjusted under 35 U.S.C. 154(b) by 157 days.

(21) Appl. No.: 15/436,255

(22) Filed: Feb. 17, 2017

(65) Prior Publication Data
US 2017/0297018 A1    Oct. 19, 2017

(30) Foreign Application Priority Data
Feb. 19, 2016  (NL) ........................... 2016290

(51) Int. Cl.
*B01L 3/00*  (2006.01)
*G03F 7/075*  (2006.01)
*G03F 7/20*  (2006.01)

(52) U.S. Cl.
CPC ...... *B01L 3/502707* (2013.01); *G03F 7/0755* (2013.01); *G03F 7/2004* (2013.01); *B01L 2200/12* (2013.01); *B01L 2300/0816* (2013.01); *B01L 2300/12* (2013.01); *B01L 2300/16* (2013.01)

(58) Field of Classification Search
None
See application file for complete search history.

(56) References Cited

U.S. PATENT DOCUMENTS 6,569,979 B1    5/2003  Strother et al.
2002/0182747 A1  12/2002  Beebe et al.

OTHER PUBLICATIONS

Jancar et al., Hydrolytically Stable Interphase on Alumina and Glass Fibers via Hydrosilylation, Composite Interfaces, Jan. 1, 2011, 18(8): 633-644.
Effenberger et al., Photoactivated Preparation and Patterning of Self-Assembled Monolayers with 1-Alkenes and Aldehydes on Silicon Hydride Surfaces, Angewandte Chemie, Oct. 2, 1998, 37(18):2462-2464.
Huck et al., UV-initiated hydrosilylation on hydrogen-terminated silicon (111): rate coefficient increase of two orders of magnitude in the presence of aromatic electron acceptors, Langmuir. Nov. 27, 2012;28(47):16285-93.
Search Report for NL application No. 2016290 dated Feb. 19, 2016, 8 pages.

*Primary Examiner* — Xiaoyun R Xu
(74) *Attorney, Agent, or Firm* — Michael J. Blessent; Bret E. Field; Bozicevic, Field & Francis LLP

(57) ABSTRACT

A process for the modification of a solid material, said process comprising contacting a surface of the solid material comprising nucleophilic groups with a hydrosilane in a first step to produce a hydrosilanized surface, and contacting said hydrosilanized surface with at least one alkene and/or alkyne under irradiation with visible and/or ultraviolet light in a second step.

17 Claims, 9 Drawing Sheets

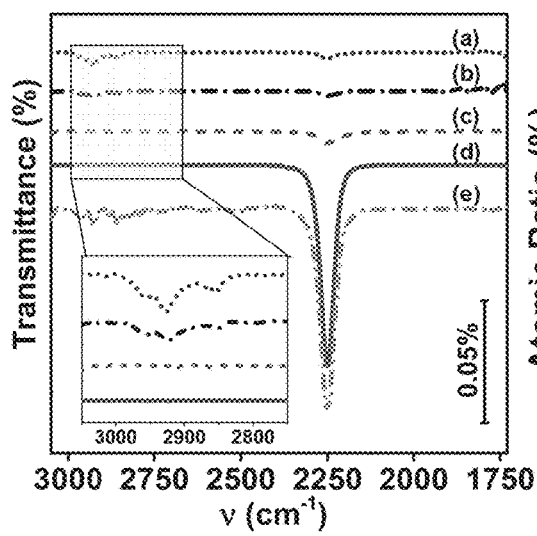
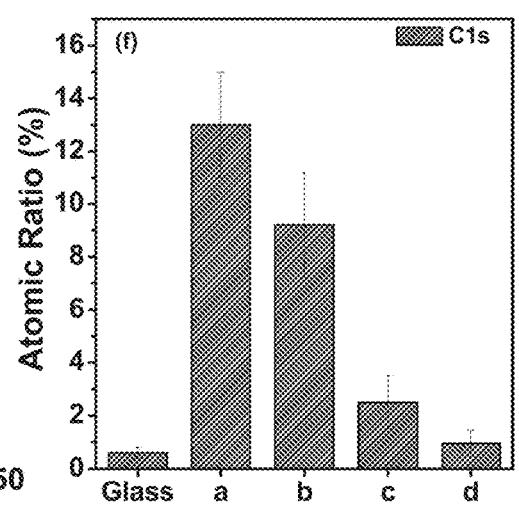
Fig. 1A
Fig. 1B

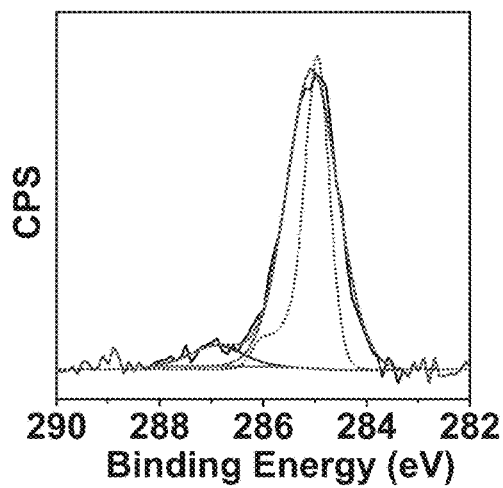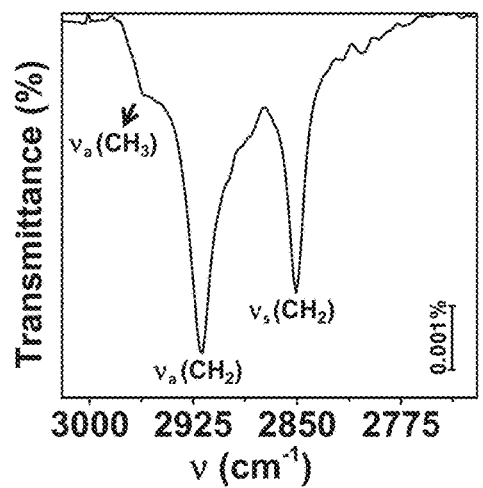
Fig. 3A
Fig. 3B

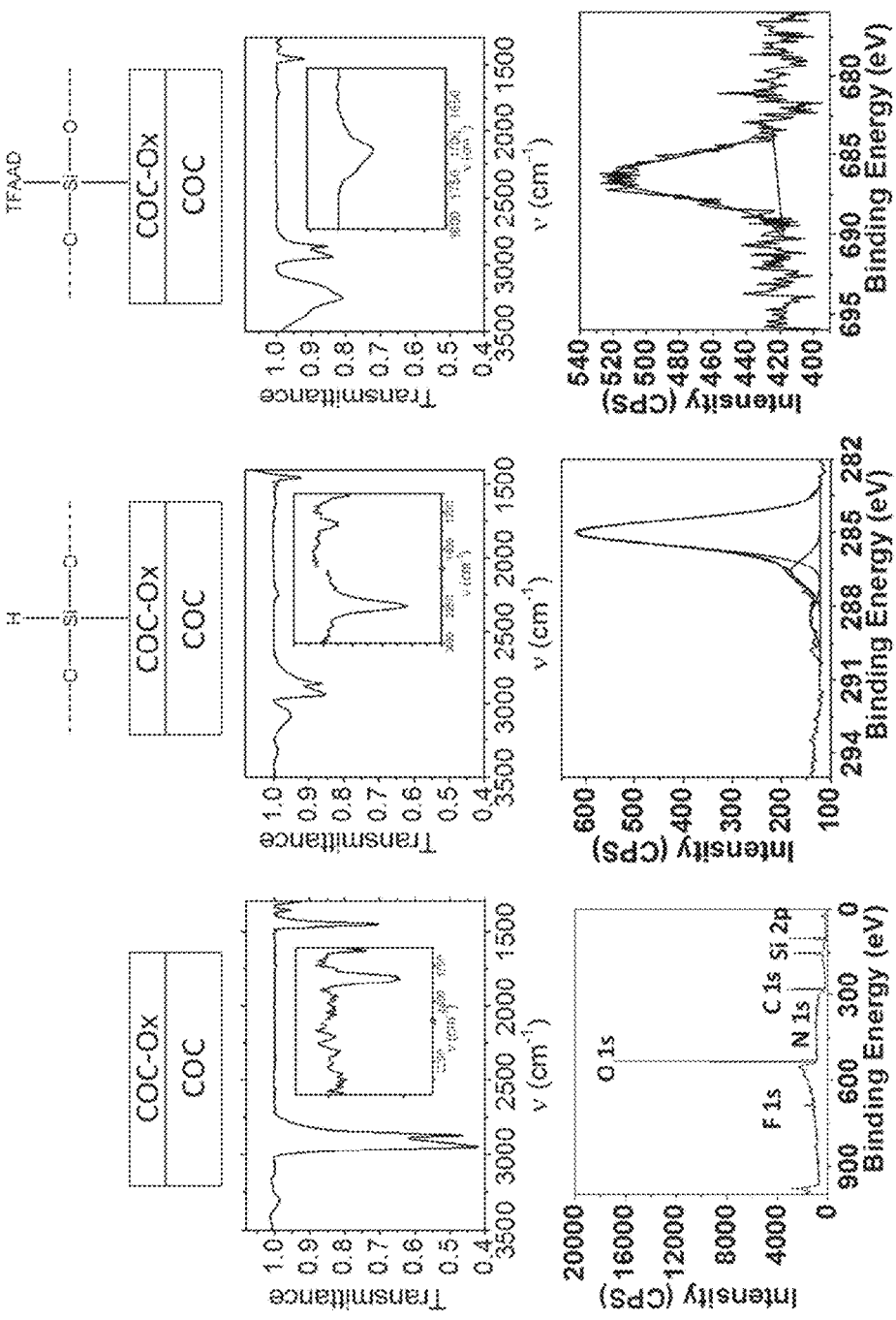

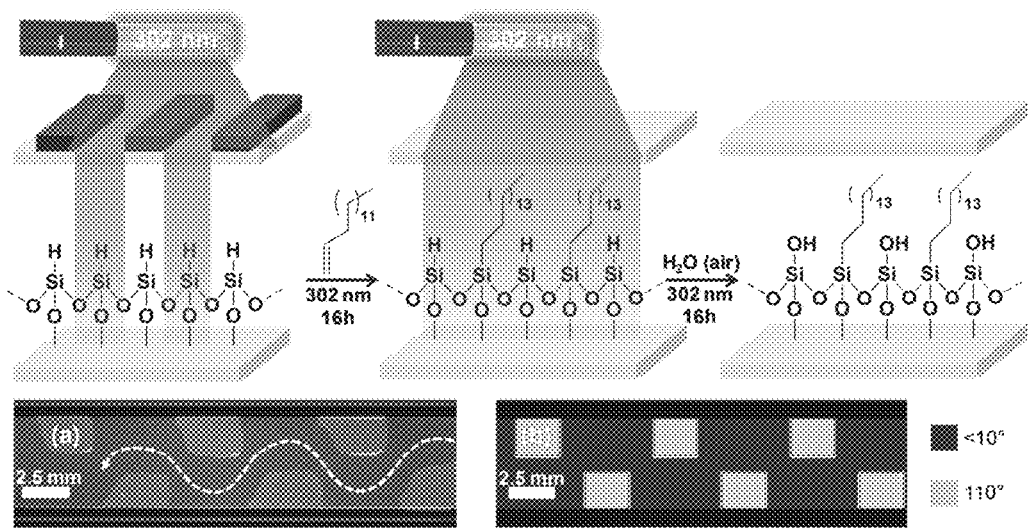

PHOTOCHEMICAL MODIFICATION OF A SOLID SURFACE

FIELD OF THE INVENTION

The invention relates to a process for photochemically modifying a solid surface, for example, a silicon dioxide (silica) or glass surface, and a product formed using this process. In addition, the invention may relate to a method of photochemically modifying the internal surface of microchannels of a microfluidic chip, and a microfluidic chip chemically modified by this process.

BACKGROUND

The ability to modify the surface of a solid material such as glass has facilitated many biomedical and chemical applications.[1,2,3,4,5]

Known methods of modifying planar surfaces such as glass surfaces include a wide range of non-contact methods such as inkjet printing,[6] photolithography,[7] and plasma deposition.[8,9]

These non-contact modification methods do not, however, work so well on non-planar surfaces. For example, the inside of a glass microchannel is far less amenable to these patterning methods.[10] Therefore, the modification of the inside surface of glass microchannels has used soft lithography methods such as microcontact printing.[11] However, as these soft lithography methods can only be used on exposed channel surfaces before sealing, the properties of the modified surfaces need to be compatible with any subsequent sealing process, for example, high-temperature fusion bonding of glass onto glass.

It is also known to use photolithographic methods to pattern the surface of a solid material such as glass. In order to work, the wavelength of the light used in the photolithographic method must not be fully absorbed by the solid material. In addition, the more of the light that is absorbed, the less well the photolithographic method works (i.e. the photolithographic method will work to a lesser extent). Therefore, photolithographic methods are limited by the degree to which the solid material (and the reagents used in the method) absorbs the light.

These limitations concerning the photolithographic method are particularly relevant when attempting to pattern the internal surface of a structure such as a glass microchannel. In such methods, the light is applied from the outside of the structure. Therefore, if the light is substantially absorbed by the structure itself, no patterning will occur on its internal surface. As a result of these limitations, commonly used glass modification chemistries like phosphonic acid,[13] or catechol-based[14] approaches do not allow a photolithographic process to be carried out on the inside of a glass microchannel.[12]

The photochemical attachment of alkenes to glass surfaces has allowed the local formation of densely packed, stable organic monolayers with reactive functional groups onto exposed surfaces,[15,16] for example, onto the inside of a glass microchannel.[17] This has enabled, for example, the subsequent local attachment of fragile biologically active materials, such as DNA-enzyme hybrids which could then be used to construct an enzyme cascade in a microchannel.[18] In order to perform the photochemical attachment of the alkenes, this photochemical reaction was limited to wavelengths lower than 285 nm.

At wavelengths of 285 nm or less many organic moieties start to undergo photochemical transformations. In addition, some solid materials, for example, glass, absorb a significant portion of light with wavelengths lower than 285 nm. As well as hindering the photochemical reaction, the absorbance of light by the solid material may heat this material allowing secondary reactions to take place. Finally, alkene attachment at wavelengths of 285 nm or smaller also yields multilayer formation for many functional groups.[19] In some cases, multilayer formation can be disadvantageous because of reduced reproducibility on the molecular scale.

The present invention is, therefore, directed towards an improved method for modifying the surface of a solid material. This improved method may at least partially avoid one or more of the disadvantages mentioned above. Preferably, the method of the present invention can be used on both planar and non-planar surfaces.

SUMMARY OF THE INVENTION

In a first aspect, the present invention relates to a process for the modification of a solid material, said process comprising contacting a surface of the solid material comprising nucleophilic groups with a hydrosilane in a first step to produce a hydrosilanized surface, and contacting said hydrosilanized surface with at least one alkene and/or alkyne under irradiation with visible and/or ultraviolet light in a second step.

This first aspect of the invention is a novel photochemical process. This process makes it possible to reliably add a layer of the at least one alkene and/or alkyne to a surface of the solid material.

Preferably, the process adds a monolayer of the at least one alkene/alkyne to the surface of the solid material.

The solid material modified in this process is defined as a material that is in the solid state whilst the process is being carried out. For example, if the process is conducted at room temperature, the solid material is a material that is in the solid state at room temperature.

Any hydrosilane that can react with nucleophilic groups on the surface of the solid material to produce a hydrogen-terminated layer on this surface is suitable for use in the first aspect of the invention. In embodiments of this process, the hydrosilane may have the following formula:

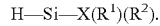

wherein X is a hydrolysable group such as an alkoxy, acyloxy, halogen or amine group.

$R^1$ and $R^2$ can be the same as, or different to, the hydrolysable group X. If $R^1$ and $R^2$ are both the same as X, the formula can be simplified to: H—Si—$X_3$ As in the example above, the R' and $R^2$ groups may be the same. Alternatively, the two substituents may be different. For example, in one embodiment $R^1$ may be the same a group X and $R^2$ may be different. In such embodiments, the general formula of the hydrosilane would be: H—Si—$X_2$(R)

The R group substituent (including $R^1$ and $R^2$) may be an organic or organometallic moiety or an inorganic atom or group.

In some embodiments, the R group may provide radical stability during the second step of the process of the invention (i.e. during the Si—H dissociation). In embodiments in which the R substituent provides radical stability, this may enable the second step of the process to be carried out under irradiation at longer wavelengths. R groups that may provide such radical stability include vinyl and phenyl groups.

Alternatively, the R substituent may provide an additional functionality with a reactivity orthogonal to the Si—H bond, thereby yielding two independent modes of functionalisation. In some embodiments, the R group may provide this additional functionality in addition to radical stability. R groups that may provide such features include azide groups.

In some embodiments, the hydrolysable X group may be a chloro or alkoxy group, i.e. X may be Cl or $OC_nH_{2n+1}$.

If the hydrosilane is an alkoxysilane, this alkoxysilane may have the general formula $H—Si(OC_nH_{2n+1})_{3-x}R_x$, where x=0, 1 or 2.

If the hydrosilane is a chlorosilane, this chlorosilane may have the general formula $H—SiCl_{3-x}R_x$, where x=0, 1 or 2.

In these general formulas for an alkoxysilane and a chlorosilane, the R group may be an organic, organometallic or inorganic moiety.

Any chloro or alkoxy silane that can react with nucleophilic groups present on the surface of the solid material to produce a hydrogen-terminated layer on this surface is suitable for use in the first aspect of the invention. Suitable hydrosilanes for use in the first step of the process include, but are not limited to, triethoxysilane ($H—Si(OC_2H_5)_3$), trimethoxysilane ($H—Si(OCH_3)_3$) and trichlorosilane ($H—SiCl_3$).

The first step of the process involves the silanization of a surface of the solid material with a hydrosilane. Any surface that is capable of reacting with the abovementioned hydrolysable group (X), for example a chloro and/or alkoxy group, of the silane can be used in this silanization step. Therefore, the surface of the solid material comprises one or more types of nucleophilic moieties (also know as "nucleophilic groups").

For example, in some embodiments, the nucleophilic moieties may be hydroxyl, silanol, thiol or amine groups.

Therefore, in embodiments in which the process comprises the modification of a solid material having a surface comprising hydroxyl groups as the nucleophilic groups, said process comprises contacting said surface with a hydrosilane in a first step to produce a hydrosilanized surface, and contacting said hydrosilanized surface with at least one alkene or alkyne under irradiation with light in a second step.

In such embodiments, hydroxyl groups present on the surface of the solid material are converted into a hydrogen-terminated (hydrosilane) layer by modification with the silane.

In some embodiments, the solid material may comprise silicon dioxide, glass such as borosilicate glass or synthetic fused silica, aluminium oxide, other metal oxides, zeolites, or a polymer that can form a hydrosilane layer on its surface. Suitable polymers include hydroxyl-terminated polymers, or activated COC or cyclic olefin copolymer (COP) that present such —OH moieties on their surfaces after activation, for example, by an air plasma treatment.

In embodiments in which the solid material comprises glass, the silanized surface of the glass produced by the first step of the process may be referred to as "H-glass".

In the second step of the process, a light-induced reaction between the silanized surface and one or more alkenes or alkynes takes place.

The exact wavelength of the visible or ultraviolet light most suitable for use in the process depends upon the particular silane and alkene/alkyne used in the reaction. For example, if the silane has a substituent which can provide radical stability, Si—H dissociation may be achieved more readily.

In some embodiments of the process, the silanized surface may be contacted with at least one alkene/alkyne under irradiation with light with a wavelength between 200 nm and 700 nm, for example, between 254 nm and 700 nm.

In some embodiments of the process, the silanized surface is contacted with at least one alkene or alkyne under irradiation with ultraviolet light in the second step. In such embodiments, the ultraviolet (UV) light may have a wavelength between 254 nm and 400 nm. Preferably, the UV light used in the second step of the process has a wavelength between 285 nm and 400 nm, for example, between 300 nm and 400 nm.

Preferably, the process uses UV light with a wavelength of between 285 nm and 365 nm. More preferably, the wavelength of UV light used in the process is between 300 nm and 364 nm, for example, between 300 nm and 355 nm. In some embodiments, the wavelength has a wavelength between 302 nm and 330 nm. In some embodiments, the UV light may have a wavelength of 302 nm.

Additionally, the present invention may provide a process for the patterning of the solid material. In such methods, the process comprises exposing the silanized surface to visible or UV light through a mask, for example, a photomask, in the second step of the process. Such a photolithographic method enables the modification of controlled areas of the surface of the solid material.

In carrying out a process in accordance with a first aspect of the invention, it may be possible to add a monolayer to the internal surface of a structure such as a microchannel, for example, the microchannel of microfluidic chips, by applying the light at the external surface of the structure.

If the process is used to modify an internal surface of a structure by applying the visible and/or UV light to the external surface of the structure, the solid material forming the structure must be at least partially transparent to the wavelength of the light used in the photochemical process.

If the structure is a glass microchannel, for example, a borosilicate glass microchannel, preferably the UV light is applied to the outside of the microchannel. In some embodiments, the UV light may have a wavelength between 300 nm and 400 nm. As mentioned above, an example of a suitable wavelength of the UV light is 302 nm.

The alkene or alkyne used in the process may be any alkene or alkyne capable of reacting with the silane deposited onto the surface of the solid material.

Preferably, the alkene/alkyne is terminal alkene/alkyne, i.e. and alkene/alkyne molecule with the alkene-alkyne functional group located at the end of the molecule. For example, the silanized surface can be contacted with any alkene or alkyne comprising between 2 and 50 carbon atoms. Specific examples of suitable terminal alkenes and alkynes include 1-hexadecene, 10-aminodec-1-ene or 1-hexadecyne.

The alkene or alkyne molecule may also be optionally substituted with a functional group, for example, an amine group, a halogen (for example Cl or F), a carboxylic acid group etc. If the alkene or alkyne molecule is substituted by a functional group, this functional group may be protected by a protective group.

For example, as the amine group of 10-aminodec-1-ene is relatively reactive, it may be preferable to attach a protective group to this functional group. Therefore, in some embodiments, the process may use a trifluoroacetic acid-protected 10-aminodec-1-ene.

In general, embodiments of the process may use an alkene or alkyne with the general formula:

$$A\text{-}(E1)_n\text{-}F1$$

where A is the alkene, E1 is an alkyl chain comprising n carbon atoms, and F1 is an optional functional group attached to this alkyl chain.

For example, for both 1-hexadecene and 1-hexadecyne, the formula would be A-(E1)$_{14}$.

For 10-aminodec-1-ene, the formula would be A-(E1)$_8$-NH$_2$.

As discussed above, the alkene or alkyne may also further comprise a protective group bonded to the F1 group of the molecule.

In a second aspect, the present invention relates to a microfluidic chip, wherein the microfluidic chip comprises at least one microchannel, and wherein an internal surface of the microchannel is at least partially covered by a layer, wherein said layer is obtainable by a method according to the present invention.

According to the present invention, said layer is formed by reacting hydrosilanes bonded to the internal surface of the microchannel with at least one alkene or alkyne under irradiation with light.

Additionally, the process according to the present invention may provide patterning of the layer, by locally forming the layer on the internal surface of the solid material. In exemplary embodiments of the method, the process comprises exposing the silanized surface to visible or UV light through a mask, for example, a photomask, in the second step of the process. Such a photolithographic method enables the modification of controlled areas of the internal surface of the solid material, thereby locally forming the layer on the internal surface of the solid material.

In an exemplary embodiment, the internal surface of the microchannel is locally covered by a patterned layer and the second step of contacting said hydrosilanized surface with at least one alkene and/or alkyne under irradiation with visible and/or ultraviolet light comprises exposing the silanized surface to said visible light or UV light through a mask.

In embodiments of the microfluidic chip, the layer may be a monolayer.

In some embodiments, the chip may be a glass microfluidic chip, for example, a borosilicate glass microfluidic chip. If the microfluidic chip is formed from borosilicate glass, preferably the UV light used has a wavelength between 300 nm and 400 nm. An example of a suitable wavelength of the UV light is 302 nm.

In the second aspect of the invention, the internal surface of the microchannels is preferably modified by applying the UV light to an external surface of the structure. Therefore, in such embodiments, the microfluidic chip must be at least partially transparent to the ultraviolet or visible light in one or more areas surrounding the microchannel(s).

DESCRIPTION OF THE FIGURES

FIG. 1A shows a GATR-FTIR spectrum (left), and a graph FIG. 1B showing XPS results (right);

FIG. 3A shows an XPS C1s narrow scan of a 1-hexadecyl monolayer on H-glass overlaid with a DFT-based simulation (dotted) of the C1s narrow scan; and FIG. 3B shows a GATR-FTIR spectrum of a 1-hexadecyl monolayer on H—SiCl$_3$-based H-glass;

FIG. 5A shows a GATR-FTIR of plasma-treated COC; FIG. 5B shows a GATR-FTIR of plasma-treated COC after silanization (i.e. after silane treatment); FIG. 5C shows a GATR-FTIR of H—Si—COC after subsequent monolayer attachment; FIGS. 5D and 5E provide XPS spectra of TFAAD-modified H—Si—COC where: FIG. 5D provides a XPS wide scan, FIG. 5E provides a XPS C1s narrow scan, and FIG. 5F provides a XPS F1s narrow scan.

FIG. 7A shows a schematic representation of the photolithographic attachment of 1-hexadecene on the inside of a microchannel, followed by photo-oxidation of the remaining Si—H moieties for enhanced contact angle contrast (top); FIG. 7B provides a macro-photograph of a microfluidic channel; and FIG. 7C provides a schematic representation of the used photolithographic mask placed on top of the microchannel.

DETAILED DESCRIPTION OF THE INVENTION

Figures 2A, 2B:
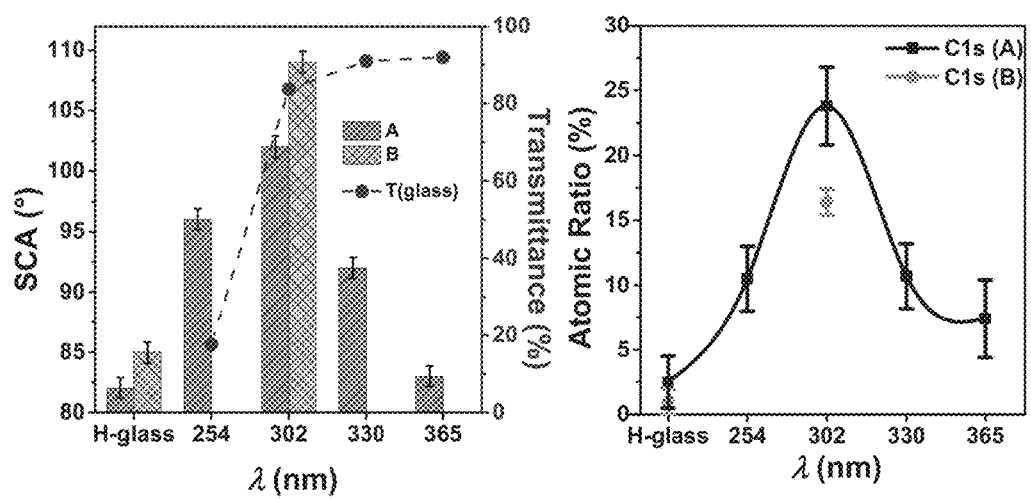
FIG. 2A shows a graph detailing static water contact angles.
FIG. 2B shows a graph showing XPS analysis.

Static Water Contact Angle Measurements (SCA):

Static water contact angles (SCA) were measured using a Krüss DSA-100 goniometer. Droplets of 3 μL were dispensed on the surface, and contact angles measured with a CCD camera using a tangential method. The reported value is the average of at least five droplets of at least three different samples, and has an error of ±1° between samples.

Germanium Attenuated Total Reflection Fourier Transform Infrared Spectroscopy (GATR-FTIR):

GATR-FTIR spectra were recorded with a Bruker Tensor 27 FT-IR spectrometer, using a commercial variable-angle reflection unit (Auto Seagull, Harrick Scientific). A Harrick grid polarizer was installed in front of the detector and was used for measuring spectra with p-polarized radiation with respect to the plane of incidence at the sample surface. Single channel transmittance spectra were collected at an angle of 25° using a spectral resolution of 2 cm$^{-1}$ and 2048 scans while flushing with dry N$_2$. Obtained spectra were referenced with a clean H-glass substrate (H-glass substrates were referenced with freshly plasma-cleaned glass).

Example: X-Ray Photoelectron Spectroscopy (XPS):

XPS spectra were recorded on a JPS-9200 photoelectron spectrometer (JEOL, Japan). The analysis was performed under ultra-high vacuum conditions using a monochromatic Al Kα source at 12 kV and 20 mA and an analyzer pass energy of 10 eV. A takeoff angle ϕ of 80° was used, with a precision of ±1°. All XPS spectra were analyzed with Casa XPS software (version 2.3.15). The binding energies were calibrated on the hydrocarbon (CH$_2$) peak with a binding energy of 285.0 eV. Because of the electrostatic charging of the surface during the measurements, a charge compensation was used with an accelerating voltage of 2.8 eV and a filament current of 4.80 A.

Atomic Force Microscopy (AFM):

AFM images (512×512 pixels) were obtained with an MFP3D AFM (Asylum Research, Santa Barbara, Calif.). The imaging was performed in contact mode under air using NP silicon nitride cantilevers with a stiffness of 0.58 N/m (Veeco Metrology, Santa Barbara, Calif.) at a scan speed of 1 µm/s. Images were flattened with a zeroth-order flattening procedure using MFP3D software. Scanning Electron Microscopy/Scanning Auger Microscopy (SEM/SAM). Morphologies of TFAAD micropatterns were analyzed by SEM/SAM. Measurements were performed at room temperature with a scanning Auger electron spectroscope system (JEOL Ltd. JAMP-9500F field emission scanning Auger microprobe). SEM and SAM images were acquired with a primary beam of 0.8 keV. The takeoff angle of the instrument was 0°. For Auger elemental image analysis an 8 nm probe diameter was used.

Computational Procedures:

B3LYP/6-311G(d,p), M11L/6-311G(d,p), MP2/6-311G (d,p), MP2/6-311+G(d,p), and MP2/6-311++G(d,p) calculations were used to optimize geometries and study the Si—H bond dissociation energies on glass and silicon surfaces, for which we used H—Si(OSiH$_3$)$_3$ and H—Si(SiH$_2$SiH$_3$)$_3$ models, respectively. Electronic core level calculations (using natural bond orbital (NBO) analysis) were used to obtain the energies of the C1s core levels to mimic C1s XPS spectra.[21] The effect of the bulk substrate on C—Si bound monolayers was mimicked by attaching the organic species to a C—Si (OSiH$_3$)$_3$ moiety. The geometries of the different systems were for this purpose optimized at the B3LYP/6-311G(d,p) level of theory. All of the calculations were performed with GAUSSIAN09 version D1. GaussView 5.0 was used for the visualization of output files.

EXAMPLES

Materials and Chemicals

1-Hexadecene was obtained from Sigma Aldrich and distilled twice before use. Acetone (Aldrich, semiconductor grade VLSI PUNARAL Honeywell 17617), dichloromethane (DCM, Sigma Aldrich) and n-hexane (Merck Millipore) were used for cleaning before modification and Milli-Q water (resistivity 18.3 MΩ×cm) for rinsing after hydrolysis process. Cyclic olefin copolymer (COC, grade 6013) was obtained from TOPAS Advanced Polymers. All other chemicals were purchased from Sigma Aldrich and used as received. 10-Trifluoro-acetamide-1-decene (TFAAD) was synthesized based on literature methods.[20]

Substrate Preparation

Borosilicate Glass—Planar Substrate:

For monolayer formation on flat substrates, 0.7 mm thick Borofloat® 33 borosilicate glass substrates (SCHOTT) were sonicated for 10 min in semiconductor-grade acetone, subsequently dried with argon, and cleaned further using an air plasma (Harrick Scientific Products, Inc. Pleasantville, N.Y.) for 10 min. The covalent surface modification (i.e. the conversion to H-glass) was conducted directly afterwards.

Borosilicate Glass—Microchannels:

The microchannels of a microfluidic chip made from borosilicate glass (provided by Micronit Microfluidics BV.) were prepared by flushing the channels extensively with dichloromethane. The channels were subsequently dried with argon and cleaned further using an air plasma for 30 min. Again, the initial surface modification (i.e. the conversion to H-glass) could be conducted directly after this process.

In the microfluidic chip provided by Micronit, the channels were 5 mm wide, 40 mm long, and 100 µm high.

Plasma-Activated Cyclic Olefin Co Polymer (COC):

The COC substrate was sonicated in isopropanol (iPrOH) for 30 min, rinsed with iPrOH after taking it out, and dried under a stream of nitrogen. Subsequently the thus cleaned COC substrate was further activated using an air plasma (Harrick Scientific Products, Inc. Pleasantville, N.Y.) for 5 seconds.

Silanization

In the examples given below, silanization is performed using either triethoxysilane or trichlorosilane.

In the reactions with both triethoxysilane and trichlorosilane, O$_3$Si—H groups are formed onto the surface of the solid material. This bestows an entirely new chemical reactivity onto the solid material. For example, when the silanization is carried out on borosilicate glass, the deposition of O$_3$Si—H groups turns the standard Si—OH termination of the glass into Si—H termination.

Using Triethoxysilane (H—Si(OC$_2$H$_5$)$_3$), Borosilicate Glass and CVD:

For the gas-phase modification with H—Si(OC$_2$H$_5$)$_3$ by chemical vapour deposition (CVD), plasma-cleaned flat borosilicate glass substrates (1×1 cm) were placed for 8 h with H—Si(OC$_2$H$_5$)$_3$ in a desiccator under vacuum to saturate the vessel with the silane in its gaseous form. Curing of the resulting H-glass was done in a vacuum oven (16 h, 180° C., 10 mbar).

Using Triethoxysilane (H—Si(OC$_2$H$_5$)$_3$), Borosilicate Glass and CBD:

For the liquid-phase modification with triethoxysilane by chemical bath deposition (CBD), plasma-cleaned flat borosilicate glass substrates (1×1 cm) were immersed in a 10 mL cyclohexane solution of 1 mM H—Si(OC$_2$H$_5$)$_3$ at room temperature for 10 min. Afterwards the substrate was washed copiously with cyclohexane and dichloromethane, and dried under argon. As with the CVD method, the CBD method produces "H-glass".

Using Trichlorosilane (H—SiCl$_3$), Borosilicate Glass and CVD:

Chemical vapour deposition (CVD) was used for gas-phase modification with H—SiCl$_3$. Due the high reactivity of H—SiCl$_3$, this process required strictly anhydrous reaction conditions.

In this process, 500 µL of H—SiCl$_3$ was transferred into a flask (MBRAUN MB 200B) inside a glove box, where this flask is connected to a closed T-valve. This H—SiCl$_3$ system was then taken outside of the glove box and connected to a desiccator containing plasma-cleaned flat borosilicate glass substrates (1×1 cm) under an argon atmosphere. The desiccator was then placed under vacuum (10 mbar) for 1 h. Subsequent closing of the vacuum and opening the connection to the silane-containing flask fills the desiccator with trichlorosilane gas, initiating the deposition. This process was allowed to continue at room temperature for 20 min before quenching.

The deposition was quenched after 20 min by applying a vacuum of 10 mbar and refilling with argon before exposing the modified substrates to air (a base-containing trap was used to protect the pump from hydrochloric acid being generated due to contact with ambient humidity). The substrates were sonicated in dichloromethane for 20 min to remove physisorbed silane residues and subsequently dried with argon.

The resultant H-glass was directly used for surface characterization/modification or stored in the glove box until further use (with the exception of stability studies, where the resultant product was stored under air).

Using Trichlorosilane (H—SiCl$_3$), COC and CVD:

Chemical vapour deposition (CVD) was used for gas-phase modification with H—SiCl$_3$. As above, the COC substrate was held in a desiccator, and a H—SiCl$_3$ system prepared in the glove box was connected to this desiccator.

The H—SiCl$_3$ flask was then used to fill the desiccator with trichlorosilane gas, and the silanization of the COC was carried out for 30 minutes. After 30 minutes, the system was then quenched.

Photochemical Surface Modification

In example experiments carried out for the present invention, silanized substrates were subsequently used for the light-induced modification with an alkene or alkyne.

In this photochemical modification method, a drop of the chosen alkene or alkyne was placed on the flat silanized sample within a glove box. A slide, for example, a borosilicate glass slide, was then placed on the drop and gently pressed against the silanized sample to homogenously spread the alkene between the two slides, and also to mimic a closed microfluidic channel. The slide assembly was then illuminated with a UV pen lamp (with a wavelength of 254, 302, 330 or 365 nm, Jelight Company, Irvine, Calif., USA) which was placed approximately 4 mm above an external surface of either the silanized sample of the slide. The entire setup (i.e. the UV lamp and the slide assembly) was then covered in aluminium foil and the sample irradiated for 16 h. After irradiation, the substrates were extensively rinsed with distilled dichloromethane and hexane and dried under argon. The surfaces were then directly used for surface characterization or stored under air.

Using 1-Hexadecene and "H-Glass":

1-Hexadecyl monolayers were prepared by placing a drop of 1-hexadecene on an H-glass substrate, onto which a second glass slide was gently pressed as described in the general method detailed above. As in this general method, this slide assembly with 1-hexadecene was irradiated for 16 h. It was found that reacting for longer than 16 h did not give any change in the static water contact angle (SCA) or XPS results.

Using TFAAD and "H-Glass":

In accordance with the general method described above, 10-aminodec-1-ene monolayers were prepared by placing a drop of 10-trifluoroacetamide-1-decene (TFAAD) on an H-glass substrate. The modified glass surfaces were obtained via irradiation at 302 nm for 16 h. TFAAD was used because of it was desired to have low vapour pressure (to minimize evaporation) and minimal side reactions upon irradiation at the 302 nm wavelength.[40] Subsequent deprotection to yield the amine-terminated surface was performed by a brief basic hydrolysis (0.12 M NaO$^t$Bu in DMSO, 65 s) followed by extensive rinsing with water. The reaction time of the deprotection reaction is an optimized value: shorter reactions yield less deprotection, while at longer times the monolayer starts to be degraded.

Using TFAAD and the Plasma-Treated COC:

Again, in accordance with the general method described above, 10-aminodec-1-ene monolayers were prepared by placing a drop of 10-trifluoroacetamide-1-decene (TFAAD) on a plasma-treated COC substrate. The modified COC surface was obtained via irradiation at 302 nm for 16 h. The resultant product was then cleaned with DCM and hexane and sonicated in methanol for 10 minutes.

Photolithography

Planar Surface:

Photolithography was performed with a 302 nm lamp in combination with a gold electron microscope grid (SEM F1, Gilder Grids). This gold electron microscope grid (i.e. a photolithographic mask) was placed on top of a flat silanized sample of a solid material (for example, a slide of H-glass) together with a drop of a suitable alkene. After the liquid had been spread across the silanized surface of the solid material, a borosilicate glass slide (SCHOTT) was placed on top of the mask as a cover, above which the UV pen lamp was placed at a distance of approximately 4 mm. The slide assembly was irradiated for 16 h, removed from the glove box and cleaned by extensively rinsing with distilled dichloromethane and hexane and drying under argon.

In this photolithography process, the gold electron microscope grid was used to pattern the surface by locally blocking UV light.

The patterns formed on the sample were examined with optical microscopy, scanning electron microscopy (SEM), and scanning Auger microscopy (SAM).

Inside Surface of a Microchannel:

For the microchannels, photolithography was performed by applying a photolithographic mask on the bottom side of a microchip, for example, a borosilicate glass chip provided by Micronit.

This photolithographic mask was fabricated by applying an opaque tape on a glass slide (as support), and cutting the desired pattern (sketched on SolidWorks 2015) with a VersaLaser VLS2.30 (Universal Laser Systems) at 100% power and 70% speed (200 µm resolution).

In the photolithography process, the microchip was inserted into a holder (a Fluidic Connector Pro by Micronit), and the system of the chip and holder was flushed and filled with 1-hexadecene. A 302 nm lamp was placed on top of the mask at a distance of about 4 mm distance and used to irradiate for 16 h. The flows were visualized using a Canon 600D with a macro lens (f=50 mm, f/1.8 ISO100).

EXPERIMENTAL RESULTS

Example 1

Preparation of H-Terminated Glass

GATR-FTIR measurements were taken for H-glasses prepared according to the methods described above. These results are shown in the spectrum of FIG. 1A (on the left side of the figure).

In FIGS. 1A & 1B, the results (a) to (e) represent H-glass prepared by the different preparation methods recited above, in particular:
(a) H—Si(OC$_2$H$_5$)$_3$—CBD,
(b) H—Si(OC$_2$H$_5$)$_3$—CVD, before curing,
(c) H—Si(OC$_2$H$_5$)$_3$—CVD, after curing
(d) freshly prepared H-glass samples modified by H—SiCl$_3$, and
(e) H-glass samples modified by H—SiCl$_3$ after 1 month under air (in a closed, opaque container)

The presence of the Si—H bonds was confirmed by the GATR-FTIR measurements for all the H-glasses (a) to (e) which reveal the characteristic Si—H stretching vibration at 2250 cm$^{-1}$.

For the H-glasses (a) to (c), i.e. for the triethoxysilane-based H-glass, C—H stretching bands (2800-3000 cm$^{-1}$) were also observed.[22] These C—H stretching bands are produced by ethoxy groups. It is shown in the literature that the complete removal of such ethoxy groups is possible by outgassing at 500° C.[23,24,25] These conditions are not, however, compatible with delicate glass microstructures. For such structures, the number of ethoxy groups can be significantly reduced by curing at 180° C. under vacuum for 16 h.

The effects of this curing process effect is shown by results (b) and (c) of the IR spectra of FIG. 1A. As is clear from the IR spectra, there is a significant reduction in the number of ethoxy chains on curing at 180° C. under vacuum for 16 h.

In FIG. 1B, the graph on the right gives the XPS C1s content of H-glass substrates. This graph (FIG. 1B) is a comparison of C1s atomic ratios obtained from XPS wide scans of H-glass substrates (a) to (d) compared to plasma-cleaned glass. Atomic ratios were determined by integrating the XPS C1s, O1s, and Si2p signals.

As can be seen from FIG. 1B, wide scans of a plasma-cleaned glass substrate typically indicate <1% carbon. In contrast, the H-glass surfaces produced using triethoxysilane-CVD have 9% carbon before curing (result (b)), and 2% carbon after curing (result(c)). Therefore, this XPS analysis confirms that the curing step reduces the number of ethoxy groups.

The slightly higher carbon content after curing compared to plasma-cleaned surfaces can be attributed to a combination of trace residual ethoxy groups and atmospheric contamination due to handling of the sample under air.

In addition, as is shown by FIG. 1B, the amount of carbon residue present on the surface (14% C1s by XPS) of the H-glass after carrying out the silanization step using triethoxysilane and a CBD process is higher than for the CVD process.

In contrast, the chemical vapour deposition (CVD) of trichlorosilane produces less carbon contamination than CVD of triethoxysilane.

Interestingly, H-glass was stable under air (in a closed, opaque container, r.t.) for at least a month as measured by SCA and GATR-FTIR. Minimal variation of the v(Si—H) intensity (~1%) was observed, although gradually increasing noise in the C—H stretching region indicates some slight atmospheric contamination over this month of storage.

Example 2

H-Glass Modification with 1-Alkenes

To determine the effect of using UV light with different wavelengths when performing the photochemical surface modification reaction described above, lamps with λ=254, 302, 330 or 365 nm were used and the resulting monolayers were analysed by SCA measurements.

FIGS. 2A & 2B show the results obtained during photochemical monolayer formation on H-glass using 1-hexadecene and light of different wavelengths.

In the graphs of FIGS. 2A & 2B, the results labelled "A" represent the use of H-glass formed by treatment with H—Si(OC$_2$H$_5$)$_3$ In contrast, the results labelled "B" are results obtained from H-glass that has been treated with H—SiCl$_3$ FIG. 2A (the left-hand side graph) shows a comparison of the resulting static water contact angles upon irradiation with monochromatic light and corresponding borosilicate glass transmittance values at that wavelength (labelled "T-glass"). SCA's of non-irradiated H-glass, based on H—Si(OC$_2$H$_5$)$_3$ and H—SiCl$_3$, prior to modification are also shown as a reference. In addition, H—Si(OC$_2$H$_5$)$_3$-based H-glass (B) was only used for modification with 302 nm irradiation. Also, lines have been added between the glass transmittance values to guide the eye.

FIG. 2B (the right-hand side graph) shows the XPS-based carbon content present on modified H-glass dependent on the applied irradiation conditions.

From FIG. 2A it can be seen that, when the sample is irradiated with 254 nm light (4.9 eV), the reduced transmittance of light through the glass (17.4%) greatly hinders the ability to form monolayers at this wavelength. This is despite the high energy per photon for UV light with a wavelength of 254 nm.

For the two longest wavelengths tested, 330 and 365 nm, the glass transmittance is near 100%, but the reaction either occurred only poorly (at 330 nm), or not at all (at 365 nm).

From FIG. 2A it can be seen that light with a wavelength of 302 nm (4.1 eV) has a considerably greater transmittance through 0.7 mm of glass (83.7%) than the 254 nm light. Also, as can be clearly seen from FIG. 2A, highest static water contact angle (a SCA of 102±1°) for a 1-hexadecyl monolayer formed on a H—Si(OC$_2$H$_5$)$_3$-based H-glass was obtained after irradiation at this wavelength. Therefore, 302 nm was the optimal wavelength for H—Si(OC$_2$H$_5$)$_3$-based H-glass of those studied.

A comparison of the SCA of the monolayers formed on H—Si(OC$_2$H$_5$)$_3$-based and H—SiCl$_3$-based H-glass was also performed for the 302 nm wavelength. The measured SCA for H—SiCl$_3$-based glass was 109°±1°, higher than the SCA measured for the H—Si(OC$_2$H$_5$)$_3$-based H-glass.

As can be seen from the GATR-FTIR spectrum of FIG. 1A, the Si—H IR signal on H—SiCl$_3$-based H-glass is significantly higher than the signals produced by the of H—Si(OC$_2$H$_5$)$_3$-based glass (i.e. the Si—H peak in the spectrum is much greater for sample (d) of FIG. 1A than any of samples (a) to (c)). Therefore, there appear to be more Si—H bonds in sample (d) than samples (a) to (c). It is thought that as the reactivity of —SiCl$_3$ with the glass surface is higher than the reactivity of —Si(OC$_2$H$_5$)$_3$, resulting in a higher surface density of Si—H moieties. The SCA results of FIG. 2A suggest that the surface density of Si—H moieties on H-glass plays a role in determining the overall monolayer density.

The thickness of the obtained monolayers after 16 h of irradiation with 302 nm light, on HSiCl$_3$-based H-glass, was calculated according to equation 1 with a C:Si ratio of 0.44 derived from the atomic percentages of XPS wide scans.[26]

$$d_{ML}(\text{Å}) = \lambda_{Si,C} \sin(\phi) \cdot \ln(1 + \text{C/Si}) \tag{1}$$

With $\lambda_{Si,C}$=attenuation length of Si2p photoelectrons in the hydrocarbon layer, and $\phi$=takeoff angle between the surface and the detector. $\lambda_{Si,C}$ was calculated to be 3.9 nm using the NIST Electron Effective-Attenuation-Length database.[27] The thickness of the hydrocarbon layer was thus calculated to be 1.6±0.1 nm, which is similar to the calculated length of a single 1-hexadecyl molecule (1.9 nm, determined by Chem3D) at a 32.6±0.6° tilt angle from the surface normal, and thus appears to confirm monolayer formation.

As a control, we irradiated plasma-cleaned OH-terminated glass surfaces with 1-hexadecene (302 nm, 16 h), showing no monolayer formation, in line with literature.[15] This appears to show that the described photochemical reaction at 302 nm is highly selective towards the H-glass surface. These results on H-glass show a marked improvement compared to previously reported results on hydroxyl-terminated fused silica and that of other oxides, where irradiation in the presence of 1-alkenes yields multilayer formation.[15,16]

The quality of the H—SiCl$_3$-based monolayer was also studied using XPS and GATR-FTIR. The results of these tests are shown in FIGS. 3A & 3B.

FIG. 3A shows a XPS experimental C1s narrow scan of a photochemically (302 nm, 16 h) obtained 1-hexadecyl monolayer on H-glass overlaid with a DFT-based simulation (dotted) of the C1s narrow scan.

The C1s narrow scans of these monolayers shown in FIG. 3A have two main peaks: the main C—C peak at 285 eV (93%), and a peak at 286.8 eV (~7%) corresponding to the one carbon atom per surface-bound chain ($O_3Si$—$\underline{C}H_2$—). These results are supported by B3LYP/6-311G(d,p)-derived C1s XPS simulations of 1-hexadecyl monolayer on glass.[28]

The level of short-range ordering of the hexadecyl monolayers on H-glass can be studied via GATR-FTIR measurements. FIG. 3B shows C—H stretching vibration region of the GATR-FTIR spectrum of a 1-hexadecyl monolayer on H—$SiCl_3$-based H-glass.

In FIG. 3B, methylene symmetric and antisymmetric C—H stretching vibrations are visible at 2850 and 2918 $cm^{-1}$, respectively, and can be compared to those of e.g. liquid 1-hexadecene (2854 and 2926 $cm^{-1}$, respectively) and disordered hexadecyl monolayers on hydroxyl-terminated glass (2854 and 2924 $cm^{-1}$, respectively).[15]

From the results shown in FIGS. 3A & 3B, the monolayers formed on the H-glass appear to be well-ordered monolayers with a high degree of short-range order.[29]

As shown by the results contained in Table 1 below, upon irradiation with 365 nm, no characteristic $CH_2$ IR vibrations were observed indicating that no monolayer was formed at this wavelength.

Table 1 outlines GATR-FTIR data of the antisymmetric and symmetric C—H stretching vibrations of 1-hexadecyl monolayers on H-glass (in $cm^{-1}$).[a]

TABLE 1

| | Irradiation (nm) | | | | |
|---|---|---|---|---|---|
| Method | 254<br>H—$Si(OC_2H_5)_3$ | 302<br>H—$Si(OC_2H_5)_3$ | H—$SiCl_3$ | 330<br>H—$Si(OC_2H_5)_3$ | 365<br>H—$Si(OC_2H_5)_3$ |
| $v_a(CH_3)$ | 2958 | 2955 | 2955 | 2960 | —[b] |
| $v_a(CH_2)$ | 2922 | 2920 | 2918 | 2924 | —[b] |
| $v_s(CH_2)$ | 2854 | 2850 | 2850 | 2854 | —[b] |

[a] GATR-FTIR data: p—polarized light, angle of incidence 25°.
[b] No peaks were detected.

Alkene attachment onto OH-terminated glass has an energy threshold of approximately 285 nm (i.e. at wavelengths longer than 285 nm, no alkene will be attached onto OH-terminated glass). However, at wavelengths of 285 nm of smaller, a multilayer of the alkene is formed on the glass surface.

However, with hydrosilation onto H-glass, no such multilayer formation is observed for irradiation at 302 or 330 nm. At these wavelengths the UV light appears to cause homolytic Si—H bond cleavage but not absorbed significantly by the alkene.

As mentioned above, there is no monolayer formation when UV light of 365 nm is used when the substituents of the hydrosilane used in the process are choro groups, i.e. when R=Cl. Therefore, there appears to be a threshold energy below which no grafting of the alkene will occur. We hypothesize that this threshold energy corresponds to the homolytic dissociation energy of the Si—H bond. This threshold wavelength is above the energy required for $\pi$-$\pi$* excitation of the used alkenes or alkynes, making this process extra interesting due to the minimization of alkene-based (photo-)reactions.[30]

Example 3

Introducing Chemical Functionalities onto H-Glass

Figure 4A:
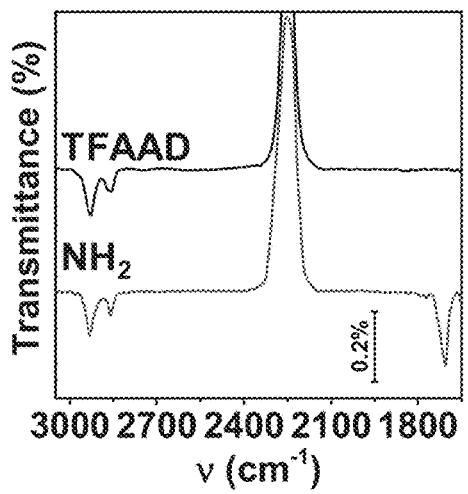
FIG. 4A shows a GATR-FTIR spectrum of an H-glass sample after photochemical modification with TFAAD and further deprotection.
Figure 4B:
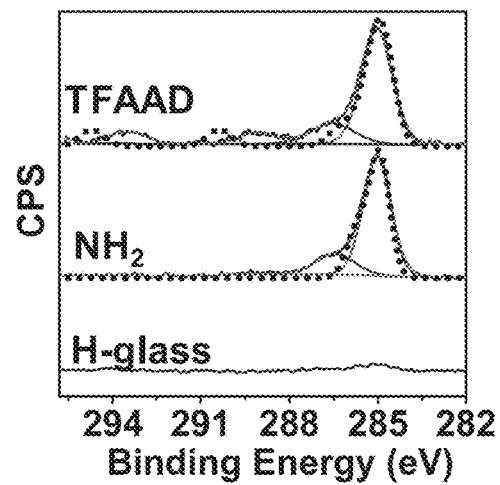
FIGS. 4B, 4C and 4D show XPS spectra.
Figure 4C:
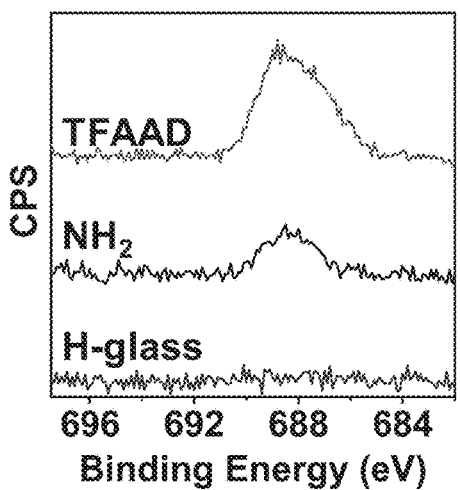
Figure 4D:
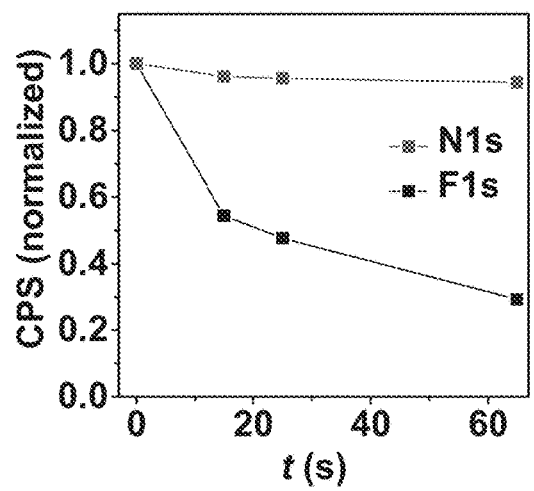

The photochemical surface modification of the H-glass was performed as described above. FIG. 4A is a GATR-FTIR spectra of an H-glass sample after photochemical modification with TFAAD and further deprotection, using H-glass as a reference spectrum. FIG. 4B shows XPS C1s with DFT-based theoretical values for C1s overlaid as a dotted line. FIG. 4C shows F1s narrow scans of TFAAD monolayer, $NH_2$-terminated monolayer and H-glass, and FIG. 4D illustrates the deprotection of TFAAD by $NaO^tBu$ over time, areas of F1s and N1s normalized to $t_0$ (TFAAD) values. Normalizing the values allows the percentage change in the initial value to be evaluated.

Figure 4E:
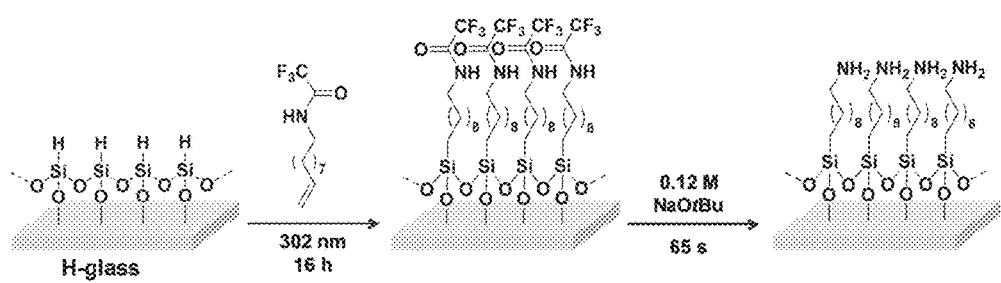
FIG. 4E provides a schematic representation of the photochemical attachment of TFAAD to H-glass, followed by deprotection of the monolayer.

FIG. 4E is a schematic representation of the photochemical attachment of trifluoroacetic acid-protected 10-aminodec-1-ene (TFAAD) to H-glass, followed by deprotection of the monolayer resulting in a primary amine-terminated surface enabling further modification.

Amino-terminated surfaces are an attractive starting point for covalent attachment of biomolecules or nanoparticles to substrates. H-glass surfaces were functionalized into amino-terminated substrates in a two-step procedure as shown in FIG. 4E.

10-aminodec-1-ene (TFAAD) modified glass surfaces were obtained according to the method of modifying H-glass described earlier.

As explained above, GATR-FTIR spectra of TFAAD and $NH_2$-terminated monolayers are depicted in FIG. 4A. The sharp peak at 1705 $cm^{-1}$ in the IR data of the TFAAD monolayer is attributed to the carbonyl stretching vibration from the amide functional group, which disappears upon deprotection. Both monolayers are disordered as concluded from the positions of the $CH_2$ stretching peaks (2928 and 2853 $cm^{-1}$ for the TFAAD monolayer, and 2930 and 2855 $cm^{-1}$ for the amine-terminated monolayer, respectively).

The XPS measurements confirm the clean formation of a monolayer. From the XPS wide scan the C:Si ratio was calculated to be 0.36, which gives a monolayer thickness of 1.2±0.2 nm according to Equation 1. This is consistent with the calculated length of a single TFAAD molecule of 1.5 nm at a 36.9±1.2° tilt angle with respect to the surface normal.

In addition, the C1s XPS spectrum of FIG. 4B confirms the attachment of intact TFAAD molecules.

FIG. 4D shows that deprotection for 65 s induces 71% loss of the F1s peak at 688.3 eV. The N1s peak area decreases in total area by only 6%, indicating a largely intact amine group.

Example 4

Introducing Chemical Functionalities onto Plasma-Treated COC

To functionalize COC with a silane, air plasma activation is first required. The plasma creates a hydroxyl surface that readily reacts with hydrogen-terminated silane (e.g. H—$SiCl_3$). The silane-modified COC (H—Si—COC) was then characterized by GATR-FTIR (see FIG. 5B), where the typical Si—H vibration band was observed at 2250 cm$^{-1}$. In accordance with the general method described above, 10-trifluoroacetamide-1-decenyl monolayers were prepared by placing a drop of 10-trifluoroacetamide-1-decene (TFAAD) on an H—Si—COC substrate. The modified COC surfaces were obtained via irradiation at 302 nm for 16 h. TFAAD was used because of the low vapour pressure (to minimize evaporation) and minimal side reactions upon irradiation at the 302 nm wavelength. Furthermore, TFAAD has the characteristic carbonyl stretching band at 1707 cm$^{-1}$ which can be detected after monolayer attachment on the surface by GATR-FTIR (see FIG. 5C).

From XPS data (attenuation of the signals of the silane-derived Si on top of the substrate) it can be derived that a 1.2 nm thick layer is formed. In addition, TFAAD also has a characteristic F peak, easily detectable by XPS (see FIGS. 5D to 5F), allowing us to quantify the monolayer formation. Otherwise, the high carbon content of COC substrates would mask the signal from carbon-only containing alkenes.

Example 5

Photolithography

To demonstrate the ability to functionalize substrates locally, photolithography was performed to pattern a TFAAD monolayer on H-glass. The results of the process are shown in FIGS. 6A to 6C.

This photolithography process was performed as described above. Therefore, in the photolithography process, a contact mask in the form of a gold electron microscope grid was used to pattern the surface with TFAAD by locally blocking irradiating light. As indicated by the Scanning Electron Microscopy (SEM) and Scanning Auger Microscopy (SAM) images, the reaction takes place within irradiated regions only. In addition, the SEM and SAM images reveal the local attachment of a monolayer and of F atoms onto the surface, respectively.

In an alternative method, the pattern could also be made visible by blowing wet air over the surface. This technique allows the visualization of the surface pattern due to the different wettability of the reacted and non-reacted areas.

Figures 6A, 6B, 6C:
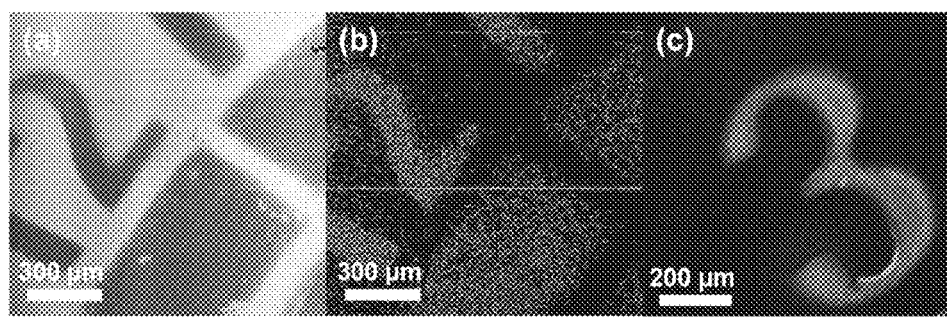
FIG. 6A shows a scanning electron microscopy (SEM) image.
FIG. 6B shows a scanning Auger microscopy (SAM) image for F1s at 686 eV of the same area.
FIG. 6C shows a fluorescence microscopy picture of the deprotected primary-amine substrate after reaction with a diisocyanate and coupling to amine-terminated fluorescent Si nanoparticles.

In order to produce the images of FIG. 6C, after deprotection of the TFAAD, the resulting amine-terminated patterned substrate was reacted with p-phenylene-diisothiocyanate (in acetone, 0.1 M) for 30 s. This reaction was immediately followed by washing with acetone and immersion in a solution of NH$_2$-terminated fluorescent, 4 nm-sized Si nanoparticles (DMSO, 50 mg/ml). After extensive washing and sonication in water and DCM, the pattern was visualized using fluorescence microscopy to produce the image of FIG. 6C.

Example 6

Photolithography in Microfluidic Channels

FIG. 7A is a schematic representation of the photolithographic attachment of 1-hexadecene on the inside of a microchannel, followed by photo-oxidation of the remaining Si—H moieties for enhanced contact angle contrast. FIG. 7B is a macro-photograph of a meandering microfluidic channel (width 5 mm, height 100 μm) with local pockets of air due to patterned hydrophobicity. FIG. 7C is a schematic representation of the photolithographic mask used to produce the patterned hydrophobicity of FIG. 7B.

As illustrated by FIGS. 7A to 7C, local photochemical attachment of 1-hexadecene onto the enclosed surface of a microchannel was achieved.

This local modification of the inside of a microchannel of a commercial microfluidic chip with 1-hexadecene (302 nm, 16 h) was studied using the photolithographic method for channels described previously, i.e. using an opaque tape locally attached onto the microchip. This opaque tape was patterned as described previously.

Surface-directed liquid flow was used to study the surface modification within the microchannel.

It is believed that the static water contact angle of any locally bound monolayer is sufficiently high to indicate monolayer formation via surface-directed liquid flow. To increase this surface-driven effect, the remaining hydrogen-terminated (i.e. the non-alkylated) areas of the microchannel were photo-oxidized to OH-terminated glass via irradiation at 302 nm for 16 h in the presence of water and air. In photo-oxidizing the non-alkylated areas, the hydrophilicity of these areas was enhanced.

If an aqueous solution is then introduced into the patterned channels, as long as the flow rate through the channel is maintained below a critical value (in our set-up, the critical value of the flow rate was 500 μL/min), the aqueous solution will be confined to the hydrophilic surface area of the channel.

To visualize this process, a solution of dyed water was introduced into the microchannel at a flow rate of 50 μL/min. As is shown by FIG. 7B, the water avoids the hydrophobic area. This creates air pockets in the hydrophobic areas. This configuration causes the liquid to swirl through the microchannel, yielding an at least partially non-laminar flow.

FIG. 7B shows that that local functionalization of a microchannel by light-induced monolayer attachment has taken place. As this local functionalization results in the formation of air pockets, the attached hydrophobic layer can function as a passive directional flow actuator and thus as fluid mixer.

In addition, the locally attached monolayers are very stable. This is indicated by the fact that the monolayer patches did not wet during 4 h of continuous water flow through the microchannels of the microfluidic chip. After 4 h, the air will start to diffuse into the water flow.

After these experiments were carried out, the microfluidic chip was stored under ambient conditions chip for two months. The chip was then removed from storage and the experiments outlined above repeated. These later experiments produced identical results to the initial experiments.

Figure 8:
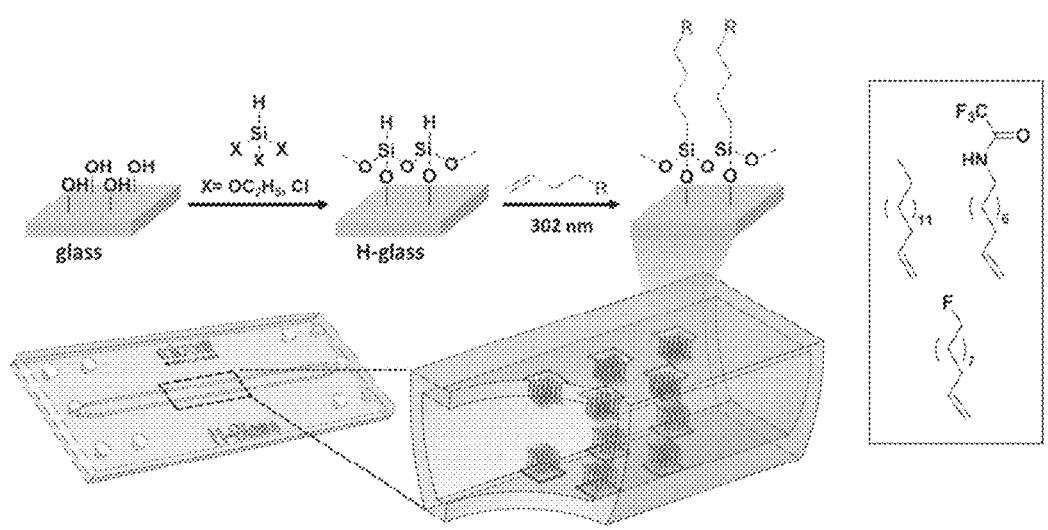
FIG. 8 shows a schematic representation of the local functionalization of the interior of standard glass microchips via light-induced reactions of terminal alkenes or alkynes with H-glass surfaces.

FIG. 8 illustrates a schematic representation of the functionalization of the interior of microchips produced by Micronit Microfluidics BV.

BIBLIOGRAPHY

1. Onclin, S.; Ravoo, B. J.; Reinhoudt, D. N. Engineering silicon oxide surfaces using self-assembled monolayers. *Angew. Chem.-Int. Edit.* 2005, 44 (39), 6282-6304.
2. Haensch, C.; Hoeppener, S.; Schubert, U. S. Chemical modification of self-assembled silane based monolayers by surface reactions. *Chem. Soc. Rev.* 2010, 39 (6), 2323-2334.
3. Herzer, N.; Hoeppener, S.; Schubert, U. S. Fabrication of patterned silane based self-assembled monolayers by photolithography and surface reactions on silicon-oxide substrates. *Chem. Commun.* 2010, 46 (31), 5634-5652.

4. Pujari, S. P.; Scheres, L.; Marcelis, A. T. M.; Zuilhof, H. Covalent Surface Modification of Oxide Surfaces. *Angew. Chem. Int. Ed.* 2014, 53 (25), 6322-6356.
5. Escorihuela, J.; Marcelis, A. T. M.; Zuilhof, H. Click Chemistry: Metal-Free Click Chemistry Reactions on Surfaces. *Adv. Mater. Interfaces* 2015, 2 (13), 1500135.
6. Belgardt, C.; Sowade, E.; Blaudeck, T.; Baumgartel, T.; Graaf, H.; von Borczyskowski, C.; Baumann, R. R. Inkjet printing as a tool for the patterned deposition of octadecylsiloxane monolayers on silicon oxide surfaces. *Phys. Chem. Chem. Phys.* 2013, 15 (20), 7494-7504.
7. Zhao, B.; Moore, J. S.; Beebe, D. J. Principles of Surface-Directed Liquid Flow in Microfluidic Channels. *Anal. Chem.* 2002, 74 (16), 4259-4268.
8. Salim, M.; Mishra, G.; Fowler, G. J. CS.; O'Sullivan, B.; Wright, P. C.; McArthur, S. L. Non-fouling microfluidic chip produced by radio frequency tetraglyme plasma deposition. *Lab Chip* 2007, 7 (4), 523-525.
9. Dixon, A.; Takayama, S. Guided corona generates wettability patterns that selectively direct cell attachment inside closed microchannels. *Biomed Microdevices* 2010, 12 (5), 769-75.
10. Priest, C. Surface patterning of bonded microfluidic channels. *Biomicrofluidics* 2010, 4 (3), 032206.
11. Nguyen, N.-T.; Wereley, S. T. *Fundamentals and applications of microfluidics*; Artech House: Boston, Mass., 2002.
12. Zhao, B.; Moore, J. S.; Beebe, D. J. Surface-Directed Liquid Flow Inside Microchannels. *Science* 2001, 291 (5506), 1023-1026.
13. Vega, A.; Thissen, P.; Chabal, Y. J. Environment-Controlled Tethering by Aggregation and Growth of Phosphonic Acid Monolayers on Silicon Oxide. *Langmuir* 2012, 28 (21), 8046-8051.
14. Malisova, B.; Tosatti, S.; Textor, M.; Gademann, K.; Ziircher, S. Poly(ethylene glycol) Adlayers Immobilized to Metal Oxide Substrates Through Catechol Derivatives: Influence of Assembly Conditions on Formation and Stability. *Langmuir* 2010, 26 (6), 4018-4026.
15. ter Maat, J.; Regeling, R.; Yang, M. L.; Mullings, M. N.; Bent, S. F.; Zuilhof, H. Photochemical Covalent Attachment of Alkene-Derived Monolayers onto Hydroxyl-Terminated Silica. *Langmuir* 2009, 25 (19), 11592-11597.
16. Huck, L. A.; Buriak, J. M. UV-Initiated Hydrosilylation on Hydrogen-Terminated Silicon (111): Rate Coefficient Increase of Two Orders of Magnitude in the Presence of Aromatic Electron Acceptors. *Langmuir* 2012, 28 (47), 16285-16293.
17. Vong, T.; ter Maat, J.; van Beek, T. A.; van Lagen, B.; Giesbers, M.; van Hest, J. C. M.; Zuilhof, H. Site-Specific Immobilization of DNA in Glass Microchannels via Photolithography. *Langmuir* 2009, 25 (24), 13952-13958.
18. Vong, T.; Schoffelen, S.; van Dongen, S. F. M.; van Beek, T. A.; Zuilhof, H.; van Hest, J. C. M. A DNA-based strategy for dynamic positional enzyme immobilization inside fused silica microchannels. *Chem. Sci.* 2011, 2 (7), 1278-1285.
19. Li, Y.; Zuilhof, H. Photochemical Grafting and Patterning of Organic Monolayers on Indium Tin Oxide Substrates. *Langmuir* 2012, 28 (12), 5350-5359.
20. Veliscek-Carolan, J.; Jolliffe, K. A.; Hanley, T. L. Selective Sorption of Actinides by Titania Nanoparticles Covalently Functionalized with Simple Organic Ligands. *ACS Appl. Mater. Interfaces* 2013, 5 (22), 11984-11994.
21. Giesbers, M.; Marcelis, A. T. M.; Zuilhof, H. Simulation of XPS C1s Spectra of Organic Monolayers by Quantum Chemical Methods. *Langmuir* 2013, 29 (15), 4782-4788.
22. Tripp, C. P.; Kazmaier, P.; Hair, M. L. A Low Frequency Infrared and ab Initio Study of the Reaction of Trichlorosilane with Silica. *Langmuir* 1996, 12 (26), 6404-6406.
23. Marrone, M.; Montanari, T.; Busca, G.; Conzatti, L.; Costa, G.; Castellano, M.; Turturro, A. A Fourier Transform Infrared (FTIR) Study of the Reaction of Triethoxysilane (TES) and Bis[3-triethoxysilylpropyl]tetrasulfane (TESPT) with the Surface of Amorphous Silica. *J. Phys. Chem. B* 2004, 108 (11), 3563-3572.
24. Montanan, T.; Herrera Delgado, M. C.; Bevilacqua, M.; Busca, G.; Larrubia Vargas, M. A.; Alemany, L. J. Surface Modification of H-Ferrierite by Reaction with Triethoxysilane. *J. Phys. Chem. B* 2005, 109 (2), 879-883.
25. Ashu-Arrah, B. A.; Glennon, J. D.; Albert, K. Preparation and characterization of bonded silica hydride intermediate from triethoxysilane and dimethylmethoxysilane using supercritical carbon dioxide and dioxane as reaction medium. *J. Chromatogr. A* 2012, 1236, 42-50.
26. Scheres, L.; Giesbers, M.; Zuilhof, H. Organic Monolayers onto Oxide-Free Silicon with Improved Surface Coverage: Alkynes versus Alkenes. *Langmuir* 2010, 26 (7), 4790-4795.
27. Powell, C. J.; Jablonski, A. The NIST Electron Effective-Attenuation-Length Database. *J Surf Anal* 2002, 9 (3), 322-325.
28. Gangarapu, S.; Pujari, S. P.; Alon, H.; Rijksen, B.; Sukenik, C. N.; Zuilhof, H. Effect of α-Heteroatoms on the Formation of Alkene-Derived Monolayers on H—Si (111): A Combined Experimental and Theoretical Study. *Langmuir* 2015, 31 (30), 8318-8327.
29. Wen, K.; Maoz, R.; Cohen, H.; Sagiv, J.; Gibaud, A.; Desert, A.; Ocko, B. M. Postassembly Chemical Modification of a Highly Ordered Organosilane Multilayer: New Insights into the Structure, Bonding, and Dynamics of Self-Assembling Silane Monolayers. *ACS Nano* 2008, 2 (3), 579-599.
30. Wang, X.; Colavita, P. E.; Streifer, J. A.; Butler, J. E.; Hamers, R. J. Photochemical Grafting of Alkenes onto Carbon Surfaces: Identifying the Roles of Electrons and Holes. *J. Phys. Chem. C* 2010, 114 (9), 4067-4074.

The invention claimed is:

1. A process for the modification of a solid material, said process comprising:
   a) contacting an internal surface of a microchannel of the solid material comprising nucleophilic groups with a hydrosilane to produce a hydrosilanized surface, wherein the nucleophilic groups comprise at least one of a hydroxyl group and a silanol group, and the hydrosilanized surface comprises $O_3Si$—H groups; and
   b) contacting said hydrosilanized surface with at least one alkene and/or alkyne under irradiation with visible and/or ultraviolet light through a mask,
   to add a patterned monolayer of the at least one alkene and/or alkyne to the internal surface of the microchannel of the solid material.

2. The process according to claim 1, wherein the nucleophilic groups are hydroxy, thiol and/or amine groups.

3. The process according to claim 2, wherein the solid material comprises silicon dioxide.

4. The process according to claim 3, wherein the solid material comprises glass.

5. The process according to claim 1, wherein the hydrosilane has the general formula H—Si—X($R^1$)($R^2$), wherein X is a hydrolysable group, and wherein $R^1$ and $R^2$ can be the same as or different to the hydrolysable group X.

6. The process according to claim 5, wherein X is an alkoxy, acyloxy, halogen or amine group.

7. The process according to claim 5, wherein the $R^1$ and/or $R^2$ group is an organic or organometallic moiety or an inorganic atom or moiety.

8. The process according to claim 1, wherein the hydrosilane comprises a trialkoxysilane (e.g. H—Si(OC$_2$H$_5$)$_3$) and/or trichlorosilane (H—SiCl$_3$).

9. The process according to claim 1, wherein the silanized surface is contacted with at least one alkene or alkyne under irradiation with ultraviolet light.

10. The process according to claim 9, wherein the ultraviolet light has a wavelength between 300 nm and 355 nm.

11. The process according to claim 10, wherein the ultraviolet light has a wavelength between 302 and 330 nm.

12. The process according to claim 1, wherein the visible and/or ultraviolet light is ultraviolet light.

13. The process according to claim 1, wherein the solid material is at least partially transparent to the light, and wherein the light is applied from outside an external surface of the microchannel.

14. The process according to claim 1, wherein the silanized surface is contacted with at least one terminal alkene or alkyne.

15. The process according to claim 1, wherein the alkene or alkyne is substituted by a functional group.

16. The process according to claim 15, wherein a protective group is bonded to the functional group.

17. The process according to claim 1, wherein the visible and/or ultraviolet light passes through an area of the solid material that is located between the mask and the hydrosilanized surface and that is at least partially transparent to the visible and/or ultraviolet light.

* * * * *